United States Patent
Im et al.

(10) Patent No.: US 9,941,342 B2
(45) Date of Patent: Apr. 10, 2018

(54) ORGANIC LIGHT EMITTING DIODE DISPLAY

(71) Applicant: Samsung Display Co., Ltd., Yongin-si, Gyeonggi-do (KR)

(72) Inventors: Choong-Youl Im, Yongin-si (KR); Il-Jeong Lee, Yongin-si (KR); Do-Hyun Kwon, Yongin-si (KR); Ju-Won Yoon, Yongin-si (KR); Moo-Soon Ko, Yongin-si (KR); Min-Woo Woo, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/088,445

(22) Filed: Apr. 1, 2016

(65) Prior Publication Data
US 2016/0218164 A1 Jul. 28, 2016

Related U.S. Application Data

(63) Continuation of application No. 13/944,247, filed on Jul. 17, 2013, now abandoned.

(30) Foreign Application Priority Data

Sep. 19, 2012 (KR) .......................... 10-2012-0103951

(51) Int. Cl.
*H01L 27/32* (2006.01)
*H01L 49/02* (2006.01)
(Continued)

(52) U.S. Cl.
CPC ...... *H01L 27/3265* (2013.01); *H01L 27/3248* (2013.01); *H01L 27/3262* (2013.01);
(Continued)

(58) Field of Classification Search
CPC .......................... H01L 27/3265; H01L 28/60
(Continued)

(56) References Cited

U.S. PATENT DOCUMENTS

2008/0136990 A1* 6/2008 Kimura ............... H01L 27/1218
349/46
2010/0123582 A1* 5/2010 Smith ................ G08B 13/2414
340/572.3
(Continued)

FOREIGN PATENT DOCUMENTS

| CN | 102084412 | 6/2011 |
| CN | 102569344 | 7/2012 |

(Continued)

OTHER PUBLICATIONS

Haynes, et al., "Guide to Corrosion Resistant Nickel Alloys", Haynes International, Inc., Kokomo, Indiana, 2001, pp. 1-39.

*Primary Examiner* — Bo Fan
(74) *Attorney, Agent, or Firm* — Knobbe Martens Olson & Bear LLP

(57) ABSTRACT

An organic light emitting diode display includes: a substrate; a substrate insulating layer on the substrate; a capacitor on the substrate insulating layer; a driving thin film transistor including a driving gate electrode connected to the capacitor; and an organic light emitting element connected to the driving thin film transistor, where the capacitor includes: a first capacitor electrode on the substrate insulating layer; a second capacitor electrode on the first capacitor electrode; a capacitor insulating layer between the first capacitor electrode and the second capacitor electrode and contacting the first capacitor electrode and the second capacitor electrode, the capacitor insulating layer having a higher dielectric constant than the substrate insulating layer; and an auxiliary
(Continued)

electrode contacting at least one of the first capacitor electrode or the second capacitor electrode.

8 Claims, 8 Drawing Sheets

(51) Int. Cl.
    *H01L 51/52*     (2006.01)
    *H01L 29/49*     (2006.01)

(52) U.S. Cl.
    CPC .............. *H01L 28/40* (2013.01); *H01L 28/60* (2013.01); *H01L 29/4908* (2013.01); *H01L 51/52* (2013.01); *H01L 2924/0002* (2013.01)

(58) Field of Classification Search
    USPC ............................................ 349/46; 345/207
    See application file for complete search history.

(56) References Cited

U.S. PATENT DOCUMENTS

| | | | |
|---|---|---|---|
| 2011/0254122 A1* | 10/2011 | Noda | H01L 23/5252 |
| | | | 257/530 |
| 2012/0147065 A1 | 6/2012 | Byun et al. | |
| 2012/0162169 A1* | 6/2012 | Ishizuka | G09G 3/3233 |
| | | | 345/207 |

FOREIGN PATENT DOCUMENTS

| | | |
|---|---|---|
| JP | 2001-210795 | 8/2001 |
| KR | 10-0728129 | 6/2007 |

* cited by examiner

1000

ORGANIC LIGHT EMITTING DIODE DISPLAY

CROSS-REFERENCE TO RELATED APPLICATIONS

This application is a continuation of U.S. patent application Ser. No. 13/944,247, filed Jul. 17, 2013, which claims priority to and the benefit of Korean Patent Application No. 10-2012-0103951 filed in the Korean Intellectual Property Office on Sep. 19, 2012, the entire contents of which are incorporated herein by reference.

BACKGROUND

Field

The described technology relates generally to a capacitor and an organic light emitting diode display including the same, and more particularly, to a capacitor formed on a substrate, and an organic light emitting diode display including the same.

Description of the Related Technology

A display device is a device displaying an image, and currently, organic light emitting diode displays are receiving attention.

Since the organic light emitting diode display has a self-light emitting characteristic so that a separate light source is not required unlike a liquid crystal display device, a thickness and a weight thereof may be reduced. Further, the organic light emitting diode display exhibits high-quality characteristics such as low power consumption, high luminance, and high reaction speed.

An organic light emitting diode display typically includes an organic light emitting element, a thin film transistor connected to the organic light emitting element, and a capacitor connected to a gate electrode of the thin film transistor. The capacitor includes a first capacitor electrode and a second capacitor electrode facing each other, and a capacitor insulating layer positioned between the first capacitor electrode and the second capacitor electrode.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide a capacitor having maximized capacity, and an organic light emitting diode display including the same.

A first embodiment provides a capacitor structure, which includes a substrate, a substrate insulation layer and a capacitor. The capacitor includes: a first capacitor electrode positioned on the substrate insulating layer; a second capacitor electrode positioned on the first capacitor electrode; and a capacitor insulating layer coming into contact with the first capacitor electrode and the second capacitor electrode between the first capacitor electrode and the second capacitor electrode, and having a higher dielectric constant as compared to the substrate insulating layer.

The capacitor insulating layer may include one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide.

The second capacitor electrode may include a molybdenum (Mo) alloy including nickel (Ni).

The first capacitor electrode may include the molybdenum (Mo) alloy including nickel (Ni).

The capacitor structure may further include: a first auxiliary electrode coming into contact with the first capacitor electrode; and a second auxiliary electrode coming into contact with the second capacitor electrode.

The capacitor structure may further include: a third auxiliary electrode coming into contact with the second auxiliary electrode on the second auxiliary electrode to include the molybdenum (Mo) alloy including nickel (Ni).

The first capacitor electrode may include a polysilicon semiconductor material or a metal oxide semiconductor material.

The capacitor structure may further include: a fourth auxiliary electrode coming into contact with the second capacitor electrode.

The capacitor structure may further include: a fifth auxiliary electrode coming into contact with the fourth auxiliary electrode on the fourth auxiliary electrode to include the molybdenum (Mo) alloy including nickel (Ni).

A second embodiment provides an organic light emitting diode display including: the capacitor structure described above; a driving thin film transistor including a driving gate electrode connected to the capacitor; and an organic light emitting element connected to the driving drain electrode of the driving thin film transistor.

The organic light emitting diode display may further include: a scan line extending in a first direction; a data line extending in a second direction crossing the first direction; a switching thin film transistor including a switching gate electrode connected to the scan line, a switching source electrode connected to the data line, and a switching drain electrode connected to the capacitor and the driving gate electrode; and a driving power source line connected to the driving source electrode and the capacitor of the driving thin film transistor and extending in the second direction.

According to the foregoing embodiments, there are provided a capacitor having maximized capacity, and an organic light emitting diode display including the same.

DETAILED DESCRIPTION OF CERTAIN INVENTIVE EMBODIMENTS

Figure 1:
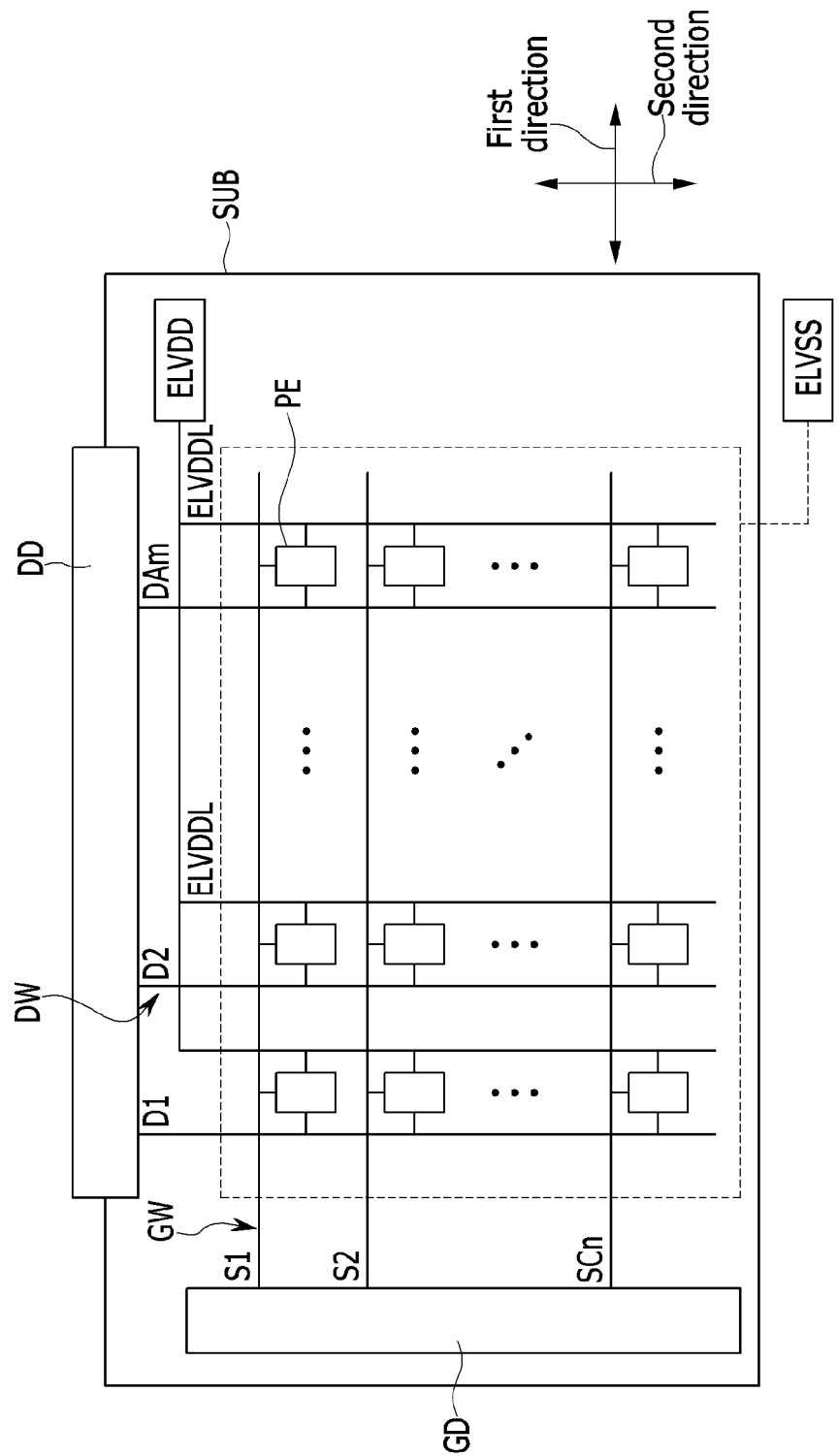
FIG. 1 is a view showing an organic light emitting diode display according to a first embodiment.

Embodiments of the present invention will be described more fully hereinafter with reference to the accompanying drawings. As those skilled in the art would realize, the described embodiments may be modified in various ways, all without departing from the spirit or scope of the present invention.

The drawings and description are to be regarded as illustrative in nature and not restrictive. Like reference numerals generally designate like elements throughout the specification.

Further, in various embodiments, since like reference numerals designate like elements having the same configuration, a first embodiment is representatively described, and in other embodiments, only a configuration different from the first embodiment will be described.

In addition, the size and thickness of each configuration shown in the drawings are arbitrarily shown for understanding and ease of description, but the present invention is not limited thereto.

In the drawings, the thickness of layers, films, panels, regions, etc., may be exaggerated for clarity. In the drawings, for understanding and ease of description, the thickness of some layers and areas may be exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, in the specification, the word "on" means positioning on or below the object portion, but does not essentially mean positioning on the upper side of the object portion based on a gravity direction.

Hereinafter, referring to FIGS. 1 to 3, an organic light emitting diode display according to a first embodiment will be described.

FIG. 1 is a view showing a display device according to a first embodiment.

As shown in FIG. 1, an organic light emitting diode display 1000 according to the first embodiment includes a substrate SUB, a gate driver GD, gate wires GW, a data driver DD, data wires DW, and a pixel PE. The pixel PE represents a minimum unit displaying an image, and the organic light emitting diode display 1000 displays the image through a plurality of pixels PE.

The substrate SUB is formed of a transparent insulating substrate formed of glass, quartz, ceramics, plastics, and the like. However, the first embodiment is not limited thereto, and the substrate SUB may be formed of a metal substrate that is formed of stainless steel and the like. Further, in the case where the substrate SUB is made of plastics and the like, the organic light emitting diode display 1000 may have a flexible characteristic, or a stretchable or rollable characteristic.

The gate driver GD corresponds to a control signal provided from an external control circuit not shown in the drawings, for example, a timing controller and the like, to sequentially provide a scan signal to the gate wires GW. Then, the pixel PE is selected by the scan signal to sequentially receive a data signal.

The gate wires GW are positioned on the substrate SUB, and extend in a first direction. The gate wires GW include scan lines SC1-SCn, and the scan line SCn is connected to the gate driver GD to receive the scan signal from the gate driver GD.

In the organic light emitting diode display 1000 according to the first embodiment, the gate wires GW include the scan line SCn, but in an organic light emitting diode display according to another embodiment, the gate wires may further include an additional scan line, an initialization power source line, a light emission control line, and the like. In this case, the display device may be an active matrix (AM) type organic light emitting diode display having a 6Tr-2Cap structure.

The data driver DD corresponds to the control signal provided from the outside such as a timing controller to provide the data signal to the data line DAm among the data wires DW. The data signal provided to the data line DAm is provided to the pixel PE selected by the scan signal whenever the scan signal is provided to the scan line SCn. Then, the pixel PE charges a voltage corresponding to the data signal, and emits light in luminance corresponding thereto.

The data wires DW may be positioned on the gate wires GW or between the gate wires GW and the substrate SUB, and extend in a second direction crossing the first direction. The data wires DW include data lines D1-DAm and a driving power source line ELVDDL. The data line DAm is connected to the data driver DD, and receives the data signal from the data driver DD. A driving power source line ELVDDL is connected to an external first power source ELVDD, and receives driving power from the first power source ELVDD.

The pixel PE is positioned in a region in which the gate wires GW and the data wires DW cross to connect the gate wires GW and the data wires DW. The pixel PE includes the first power source ELVDD, two thin film transistors and a capacitor connected to the gate wires GW and the data wires DW, and an organic light emitting element connected to a second power source ELVSS with the thin film transistor therebetween. The pixel PE is selected when the scan signal is provided through the scan line SCn, charges the voltage corresponding to the data signal through the data line DAm, and corresponds to the charged voltage to emit light of a predetermined luminance. A detailed disposal of the pixel PE is described below.

Hereinafter, referring to FIG. 2, a disposal of the pixel PE is described in detail.

Figure 2:
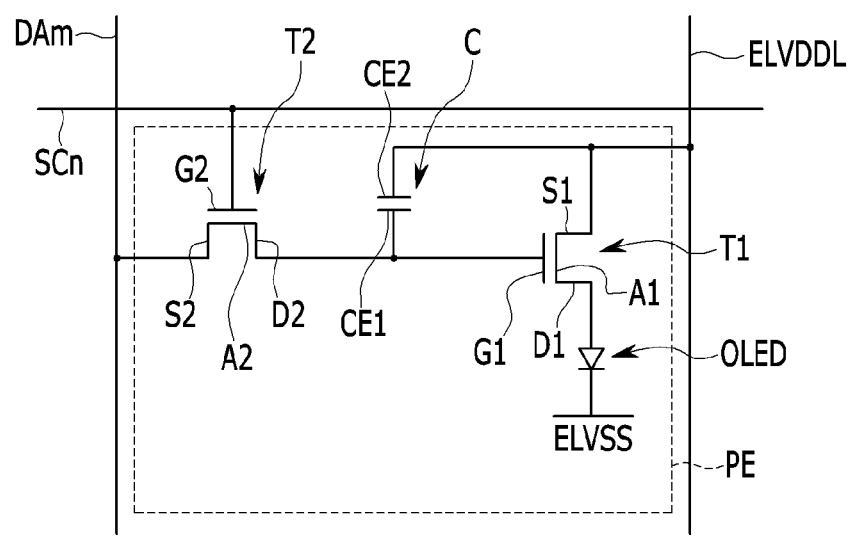
FIG. 2 is a circuit diagram showing a pixel portion shown in FIG. 1.

FIG. 2 is a circuit diagram showing a pixel portion shown in FIG. 1.

As shown in FIG. 2, one pixel PE has a 2Tr-1 Cap structure where the organic light emitting diode (OLED), two thin film transistors (TFT) T1 and T2, and one capacitor C are disposed. However, in another embodiment, one pixel may have a structure where different numbers of thin film transistors and capacitors are disposed.

The organic light emitting diode (OLED) includes a first electrode that is an anode acting as a hole injection electrode, a second electrode that is a cathode acting as an electron injection electrode, and an organic emission layer disposed between the first electrode and the second electrode.

In the first embodiment, the display device includes a switching thin film transistor T2, a driving thin film transistor T1, and a capacitor C formed for each one pixel PE.

The switching thin film transistor T2 includes a switching gate electrode G2, a switching active layer A2, a switching source electrode S2, and a switching drain electrode D2.

The switching gate electrode G2 is connected to the scan line SCn. The switching active layer A2 is positioned to correspond to the switching gate electrode G2, and the switching source electrode S2 and the switching drain electrode D2 are connected to ends thereof. The switching source electrode S2 is connected to the data line DAm. The switching drain electrode D2 is spaced apart from the switching source electrode S2 with the switching gate electrode G2 interposed therebetween to be connected to a second capacitor electrode CE2 of the capacitor C with the driving gate electrode G1 of the driving thin film transistor T1 interposed therebetween.

The driving thin film transistor T1 includes a driving gate electrode G1, a driving active layer A1, a driving source electrode S1, and a driving drain electrode D1.

The driving gate electrode G1 is connected to the switching drain electrode D2 of the switching thin film transistor T2 and the second capacitor electrode CE2 of the capacitor C. The driving active layer A1 is connected to the first capacitor electrode CE1 of the capacitor C. The driving source electrode S1 and the driving drain electrode D1 are spaced apart from each other with the driving gate electrode G1 interposed therebetween to be connected to both ends of the driving active layer A1. The driving source electrode S1 is connected to the driving power source line ELVDDL, and the driving drain electrode D1 is connected to the first electrode that is the anode of the organic light emitting diode (OLED).

That is, the switching source electrode S2 of the switching thin film transistor T2 is connected to the data line DAm, and the switching gate electrode G2 of the switching thin film transistor T2 is connected to the scan line SCn. Further, a node is formed between the switching drain electrode D2 of the switching thin film transistor T2 and the capacitor C to allow the switching drain electrode D2 of the switching thin film transistor T2 to be connected to the second capacitor electrode CE2 of the capacitor C. In addition, the switching drain electrode D2 of the switching thin film transistor T2 is connected to the driving gate electrode G1 of the driving thin film transistor T1. Moreover, the driving power source line ELVDDL is connected to the driving source electrode S1 of the driving thin film transistor T1, and the first electrode that is the anode of the organic light emitting diode (OLED) is connected to the driving drain electrode D1.

Figure 3:
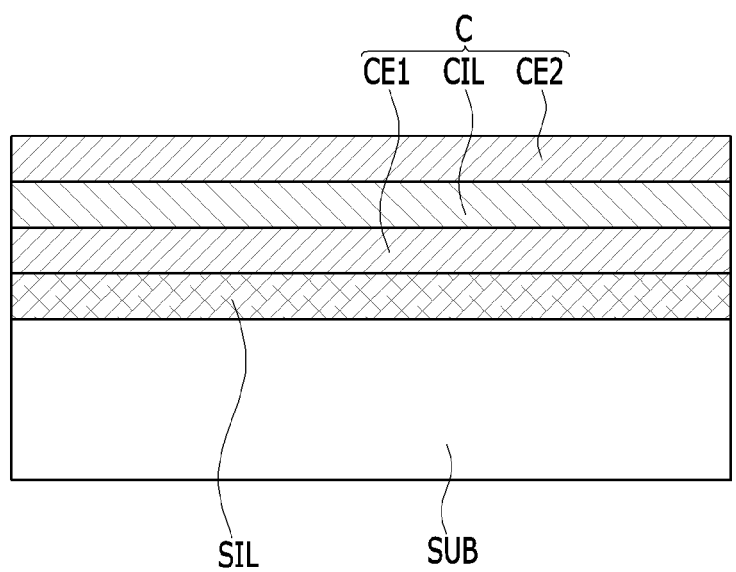
FIG. 3 is a cross-sectional view showing the capacitor shown in FIG. 2.

FIG. 3 is a cross-sectional view showing the capacitor shown in FIG. 2.

As shown in FIGS. 2 and 3, the capacitor C is positioned on the substrate insulating layer SIL positioned on the substrate SUB, and includes the first capacitor electrode CE1 and the second capacitor electrode CE2 facing each other, and the capacitor insulating layer CIL. The substrate insulating layer SIL may be an inorganic insulating layer including silicon oxide (SiOx), silicon nitride (SiNx), and the like, or an organic insulating layer including a photosensitive material.

The first capacitor electrode CE1 is positioned on the substrate insulating layer SIL, and may be formed by the same material as and by the same one process as the constitution selected from the scan line SCn, the data line DAm, the driving power source line ELVDDL, the driving gate electrode G1 of the driving thin film transistor T1, the driving source electrode S1, the driving drain electrode D1, the driving active layer A1, the switching gate electrode G2 of the switching thin film transistor T2, the switching source electrode S2, the switching drain electrode D2, and the switching active layer A2, or may be formed by the same material as the additional constitution. The first capacitor electrode CE1 is connected through the driving active layer A1 and the driving source electrode S1 of the driving thin film transistor T1 to the driving power source line ELVDDL. The first capacitor electrode CE1 includes the molybdenum (Mo) alloy including nickel (Ni). The first capacitor electrode CE1 includes the molybdenum alloy including nickel to have a thermodynamically stable state.

The second capacitor electrode CE2 is positioned on the first capacitor electrode CE1 with the capacitor insulating layer CIL interposed therebetween. The second capacitor electrode CE2 is positioned on the substrate insulating layer SIL, and may be formed by the same material as and by the same one process as the constitution selected from the scan line SCn, the data line DAm, the driving power source line ELVDDL, the driving gate electrode G1 of the driving thin film transistor T1, the driving source electrode S1, the driving drain electrode D1, the driving active layer A1, the switching gate electrode G2 of the switching thin film transistor T2, the switching source electrode S2, the switching drain electrode D2, and the switching active layer A2, or may be formed by the same material as the additional constitution. The second capacitor electrode CE2 is connected through the driving gate electrode G1 of the driving thin film transistor T1 to the switching drain electrode D2 of the switching thin film transistor T2. The second capacitor electrode CE2 includes the molybdenum (Mo) alloy including nickel (Ni). The second capacitor electrode CE2 includes the molybdenum alloy including nickel to have a thermodynamically stable state.

The capacitor insulating layer CIL comes into contact with the first capacitor electrode CE1 and the second capacitor electrode CE2 between the first capacitor electrode CE1 and the second capacitor electrode CE2, and has a higher dielectric constant as compared to the substrate insulating layer SIL. The capacitor insulating layer CIL includes one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide, and may have ten or more dielectric constants.

The switching thin film transistor T2 is used as a switch selecting the pixel PE that is to emit light. If the switching thin film transistor T2 is instantaneously turned-on, power is provided from the driving power source line ELVDDL to the first capacitor electrode CE1 of the capacitor C, and at the same time, power is provided from the data line DAm through the switching thin film transistor T2 to the second capacitor electrode CE2, thus accumulating the capacitor C by capacity. In this case, the accumulated amount of charges is proportional to the voltage applied from the data line DAm. Further, in a state where the switching thin film transistor T2 is turned-off, a gate potential of the driving thin film transistor T1 is increased according to the potential accumulated in the capacitor C. In addition, the driving thin film transistor T1 is turned-on if the gate potential is more than a threshold voltage. Then, the voltage applied to the driving power source line ELVDDL is applied through the driving thin film transistor T1 to the organic light emitting diode (OLED), and thus, the organic light emitting diode (OLED) emits light.

The aforementioned constitution of the pixel PE is not limited thereto, and may be variously modified.

As described above, in the organic light emitting diode display 1000 according to the first embodiment, the capacitor insulating layer CIL of the capacitor C includes one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide having a higher dielectric constant as compared to the substrate insulating layer SIL that is a general insulating layer to maximize capacity of the capacitor C.

Further, in the organic light emitting diode display 1000 according to the first embodiment, even though the capacitor insulating layer CIL of the capacitor C includes one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide, the first capacitor electrode CE1 and the second capacitor electrode CE2 that are in contact with the capacitor insulating layer CIL include the molybdenum alloy including thermodynamically stable nickel, such that even though heat is applied to the substrate SUB during a manufacturing process of the organic light emitting diode display 1000, undesired oxide layers are not formed at an interface between the capacitor insulating layer CIL and the first capacitor electrode CE1 and at an interface between the capacitor insulating layer CIL and the second capacitor electrode CE2. Thereby, deterioration of the capacity by the undesired oxide layer is suppressed.

In detail, for example, the first capacitor electrode and the second capacitor electrode are formed of metal such as titanium or molybdenum, and in the case where the capacitor insulating layer includes one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide, the undesired oxide layers are formed at the interface between the first capacitor electrode and the capacitor insulating layer and at the interface between the second capacitor electrode and the capacitor insulating layer by heat generated during the manufacturing process of the organic light emitting diode display in order to maximize the capacity of the capacitor. In this case, the undesired oxide layers may be formed at the interface between the first capacitor electrode and the capacitor insulating layer and at the interface between the second capacitor electrode and the capacitor insulating layer to bond oxygen included in the capacitor insulating layer and metal included in the first capacitor electrode and the second capacitor electrode to each other, such that an oxygen deficiency phenomenon occurs in the capacitor insulating layer to reduce the capacitor insulating layer into metal, thus deteriorating the total capacity of the capacitor.

However, in the capacitor C of the organic light emitting diode display 1000 according to the first embodiment, in order to maximize the capacity of the capacitor C, even though the capacitor insulating layer CIL includes one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide, the first capacitor electrode CE1 and the second capacitor electrode CE2 include the molybdenum alloy including thermodynamically stable nickel, such that even though heat is applied to the substrate SUB during a manufacturing process of the organic light emitting diode display 1000, undesired oxide layers are not formed at the interface between the capacitor insulating layer CIL and the first capacitor electrode CE1 and at the interface between the capacitor insulating layer CIL and the second capacitor electrode CE2.

That is, the capacitor C having the maximized capacity and the organic light emitting diode display 1000 including the same are provided.

Meanwhile, in the organic display device 1000 according to the first embodiment, the organic light emitting diode display including the capacitor C is described as an example, but the capacitor C according to another embodiment may be included in another display device such as a liquid crystal display (LCD).

Further, the first capacitor electrode CE1 and the second capacitor electrode CE2 of the capacitor C of the organic light emitting diode display 1000 according to the first embodiment include the molybdenum alloy including nickel, but one or more of the first capacitor electrode and the second capacitor electrode of the capacitor according to another embodiment may include a transparent conductive material such as indium tin oxide (ITO), indium zinc oxide (IZO), zinc oxide (ZnO), or indium oxide.

Hereinafter, referring to FIG. 4, a capacitor according to a second embodiment will be described.

Hereinafter, only specific portions that are different from those of the first embodiment are extracted to be described, and an omitted portion of description thereof depends on the first embodiment. Further, in the second embodiment, for better comprehension and ease of description, the same constituent elements are designated by the same reference numerals as the first embodiment.

Figure 4:
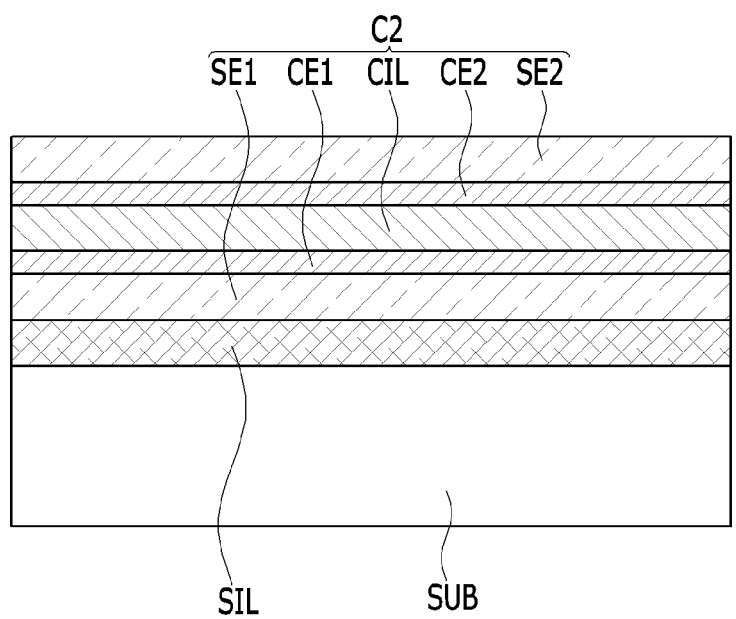
FIG. 4 is a cross-sectional view showing a capacitor according to a second embodiment.

FIG. 4 is a cross-sectional view showing a capacitor according to a second embodiment.

As shown in FIG. 4, the capacitor C2 according to the second embodiment includes a first capacitor electrode CE1, a second capacitor electrode CE2, a capacitor insulating layer CIL, a first auxiliary electrode SE1, and a second auxiliary electrode SE2.

The first auxiliary electrode SE1 is positioned between the substrate insulating layer SIL and the first capacitor electrode CE1, and is in contact with the first capacitor electrode CE1. The second auxiliary electrode SE2 is in contact with the second capacitor electrode CE2 on the second capacitor electrode CE2. The first auxiliary electrode SE1 and the second auxiliary electrode SE2 may include metal such as molybdenum or titanium.

As described above, in the capacitor C2 according to the second embodiment, since the first auxiliary electrode SE1 and the second auxiliary electrode SE2 come into contact with the first capacitor electrode CE1 and the second capacitor electrode CE2 to deteriorate electric resistance of each of the first capacitor electrode CE1 and the second capacitor electrode CE2, a voltage drop of a current flowing through the first capacitor electrode CE1 and the second capacitor electrode CE2 is suppressed.

That is, the capacitor C2 having the maximized capacity is provided.

Hereinafter, referring to FIG. 5, a capacitor according to a third embodiment will be described.

Hereinafter, only specific portions that are different from those of the second embodiment are extracted to be described, and an omitted portion of description thereof depends on the second embodiment. Further, in the third embodiment, for better comprehension and ease of description, the same constituent elements are designated by the same reference numerals as the second embodiment.

Figure 5:
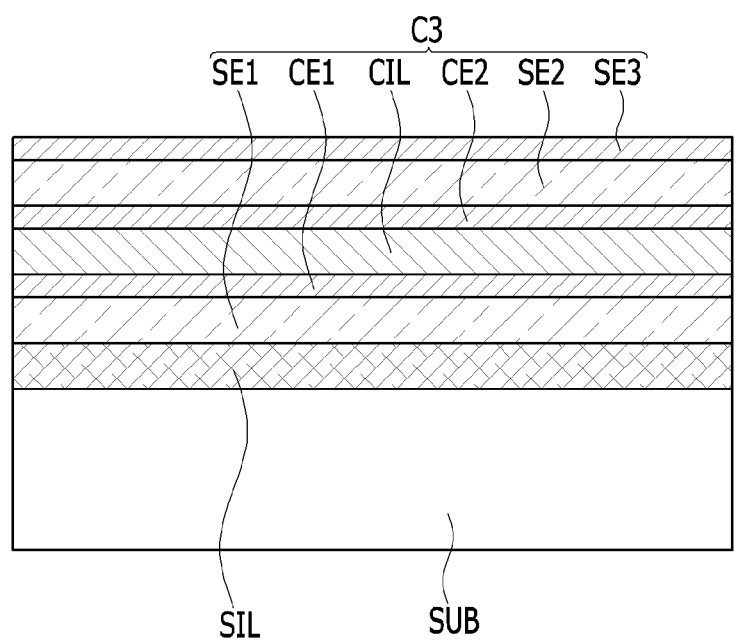
FIG. 5 is a cross-sectional view showing a capacitor according to a third embodiment.

FIG. 5 is a cross-sectional view showing a capacitor according to a third embodiment.

As shown in FIG. 5, the capacitor C3 according to the third embodiment includes a first capacitor electrode CE1, a second capacitor electrode CE2, a capacitor insulating layer CIL, a first auxiliary electrode SE1, a second auxiliary electrode SE2, and a third auxiliary electrode SE3.

The third auxiliary electrode SE3 is in contact with the second auxiliary electrode SE2 on the second auxiliary electrode SE2, and includes the molybdenum alloy including nickel.

As described above, in the capacitor C3 according to the third embodiment, the third auxiliary electrode SE3 including the molybdenum alloy including nickel is in contact with the second auxiliary electrode SE2 on the second auxiliary electrode SE2 formed of metal to suppress oxidation of the second auxiliary electrode SE2 by heat even though heat is applied to the substrate SUB.

That is, the capacitor C3 having the maximized capacity is provided.

Hereinafter, referring to FIG. 6, a capacitor according to a fourth embodiment will be described.

Hereinafter, only specific portions that are different from those of the first embodiment are extracted to be described, and an omitted portion of description thereof depends on the first embodiment. In addition, in the fourth embodiment, for better comprehension and ease of description, the same constituent elements are designated by the same reference numerals as the first embodiment.

Figure 6:
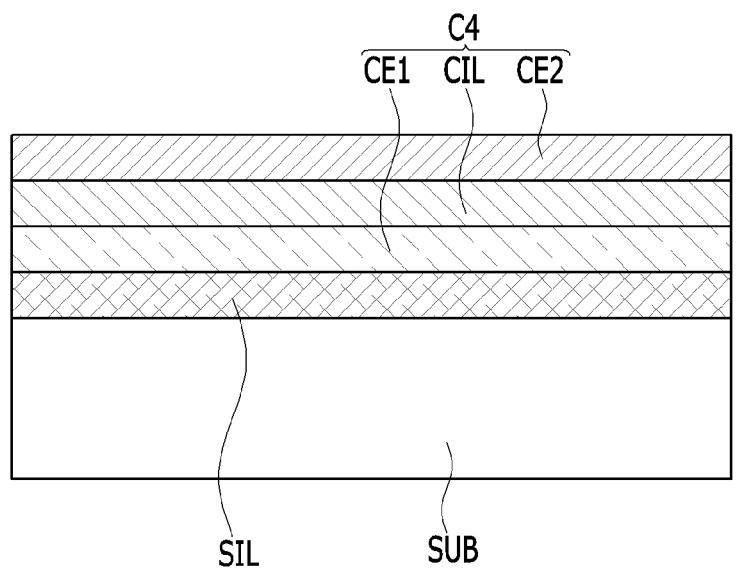
FIG. 6 is a cross-sectional view showing a capacitor according to a fourth embodiment.

FIG. 6 is a cross-sectional view showing a capacitor according to a fourth embodiment.

As shown in FIG. 6, the capacitor C4 according to the fourth embodiment includes a first capacitor electrode CE1 and a second capacitor electrode CE2 facing each other, and a capacitor insulating layer CIL.

The first capacitor electrode CE1 is positioned on the substrate insulating layer SIL, and includes the polysilicon semiconductor material or the metal oxide semiconductor material. The first capacitor electrode CE1 includes the polysilicon semiconductor material or the metal oxide semiconductor material to have a thermodynamically stable state. The first capacitor electrode CE1 may be doped with an impurity.

As described above, in the capacitor C4 according to the fourth embodiment, even though the capacitor insulating layer CIL includes one or more of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, and magnesium (Mg) oxide, the first capacitor electrode CE1 and the second capacitor electrode CE2 that are in contact with the capacitor insulating layer CIL include the thermodynamically stable silicon semiconductor material or metal oxide semiconductor material and the thermodynamically stable molybdenum alloy including nickel, such that even though heat is applied to the substrate SUB, undesired oxide layers are not formed at the interface between the capacitor insulating layer CIL and the first capacitor electrode CE1 and at the interface between the capacitor insulating layer CIL and the second capacitor electrode CE2. Thereby, deterioration of the capacity by the undesired oxide layer is suppressed.

That is, the capacitor C4 having the maximized capacity is provided.

Hereinafter, referring to FIG. 7, a capacitor according to a fifth embodiment will be described.

Hereinafter, only specific portions that are different from those of the fourth embodiment are extracted to be described, and an omitted portion of description thereof depends on the fourth embodiment. Further, in the fifth embodiment, for better comprehension and ease of description, the same constituent elements are designated by the same reference numerals as the fourth embodiment.

Figure 7:
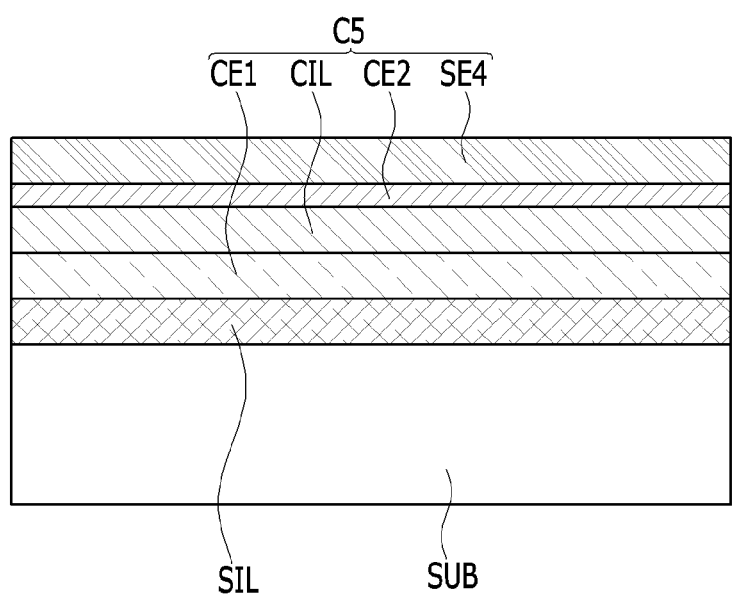
FIG. 7 is a cross-sectional view showing a capacitor according to a fifth embodiment.

FIG. 7 is a cross-sectional view showing a capacitor according to a fifth embodiment.

As shown in FIG. 7, the capacitor C5 according to the fifth embodiment includes the first capacitor electrode CE1, the second capacitor electrode CE2, the capacitor insulating layer CIL, and the fourth auxiliary electrode SE4.

The fourth auxiliary electrode SE4 is in contact with the second capacitor electrode CE2 on the second capacitor electrode CE2. The fourth auxiliary electrode SE4 may include metal such as molybdenum or titanium.

As described above, in the capacitor C5 according to the fifth embodiment, since the fourth auxiliary electrode SE4 is in contact with the second capacitor electrode CE2 to deteriorate electric resistance of the second capacitor electrode CE2, a voltage drop of a current flowing through the second capacitor electrode CE2 is suppressed.

That is, the capacitor C5 having the maximized capacity is provided.

Hereinafter, referring to FIG. 8, a capacitor according to a sixth embodiment will be described.

Hereinafter, only specific portions that are different from those of the fifth embodiment are extracted to be described, and an omitted portion of description thereof depends on the fifth embodiment. Further, in the sixth embodiment, for better comprehension and ease of description, the same constituent elements are designated by the same reference numerals as the fifth embodiment.

Figure 8:
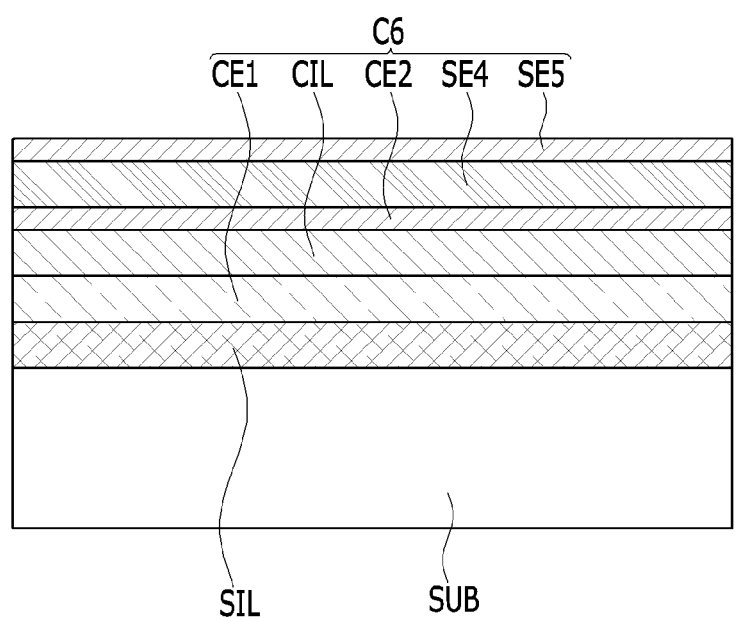
FIG. 8 is a cross-sectional view showing a capacitor according to a sixth embodiment.

FIG. 8 is a cross-sectional view showing a capacitor according to a sixth embodiment.

As shown in FIG. 8, the capacitor C6 according to the sixth embodiment includes a first capacitor electrode CE1, a second capacitor electrode CE2, a fourth auxiliary electrode SE4, and a fifth auxiliary electrode SE5.

The fifth auxiliary electrode SE5 is in contact with the fourth auxiliary electrode SE4 on the fourth auxiliary electrode SE4, and includes the molybdenum alloy including nickel.

As described above, in the capacitor C6 according to the sixth embodiment, the fifth auxiliary electrode SE5 including the molybdenum alloy including nickel is in contact with the fourth auxiliary electrode SE4 on the fourth auxiliary electrode SE4 formed of metal to suppress oxidation of the fourth auxiliary electrode SE4 by heat even though heat is applied to the substrate SUB.

That is, the capacitor C6 having the maximized capacity is provided.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

Substrate SUB, Substrate insulating layer SIL, First capacitor electrode CE1, Second capacitor electrode CE2, Capacitor insulating layer CIL

What is claimed is:

1. An organic light emitting diode display comprising:
    a substrate;
    a substrate insulating layer on the substrate;
    a capacitor on the substrate insulating layer;
    a driving thin film transistor including a driving gate electrode connected to the capacitor; and
    an organic light emitting element connected to the driving thin film transistor,
    wherein the capacitor comprises:
        a first capacitor electrode on the substrate insulating layer;
        a second capacitor electrode on the first capacitor electrode;
        a capacitor insulating layer between the first capacitor electrode and the second capacitor electrode and contacting the first capacitor electrode and the second capacitor electrode, the capacitor insulating layer having a higher dielectric constant than the substrate insulating layer; and an auxiliary electrode contacting at least one of the first capacitor electrode or the second capacitor electrode, wherein the auxiliary electrode comprises:

a first auxiliary electrode contacting the first capacitor electrode, and disposed vertically between the substrate insulating layer and the first capacitor electrode;

a second auxiliary electrode contacting the second capacitor electrode, and disposed vertically between the second capacitor electrode and a third auxiliary electrode; and the third auxiliary electrode on the second auxiliary electrode and contacting the second auxiliary electrode.

2. The organic light emitting diode display of claim 1, wherein the auxiliary electrode comprises a different material than the first capacitor electrode and the second capacitor electrode.

3. The organic light emitting diode display of claim 2, wherein at least one of the first capacitor electrode or the second capacitor electrode comprises a molybdenum (Mo) alloy including nickel (Ni), and wherein the auxiliary electrode comprises molybdenum (Mo) or titanium (Ti).

4. The organic light emitting diode display of claim 1, wherein the third auxiliary electrode comprises the same material as the second capacitor electrode.

5. The organic light emitting diode display of claim 1, wherein the auxiliary electrode comprises a fourth auxiliary electrode contacting the second capacitor electrode.

6. The organic light emitting diode display of claim 5, wherein the auxiliary electrode further comprises a fifth auxiliary electrode on the fourth auxiliary electrode and contacting the fourth auxiliary electrode, and wherein the fifth auxiliary electrode comprises the same material as the second capacitor electrode.

7. The organic light emitting diode display of claim 1, wherein at least one of the first capacitor electrode and the second capacitor electrode comprises the same material as the driving gate electrode.

8. The organic light emitting diode display of claim 1, wherein: the capacitor insulating layer comprises at least one of zirconium (Zr) oxide, hafnium (Hf) oxide, titanium (Ti) oxide, tantalum (Ta) oxide, lanthanum (La) oxide, yttrium (Y) oxide, barium (Ba) oxide, strontium (Sr) oxide, calcium (Ca) oxide, or magnesium (Mg) oxide.

* * * * *